(12) United States Patent
Achari et al.

(10) Patent No.: US 6,307,240 B1
(45) Date of Patent: Oct. 23, 2001

(54) PULSED ETCHING MANUFACTURING METHOD AND SYSTEM

(75) Inventors: Achyuta Achari, Canton; Lakhi N. Goenka, Ann Arbor, both of MI (US)

(73) Assignee: Visteon Global Technologies, Inc., Dearborn, MI (US)

(*) Notice: Subject to any disclaimer, the term of this patent is extended or adjusted under 35 U.S.C. 154(b) by 0 days.

(21) Appl. No.: 09/746,689

(22) Filed: Dec. 22, 2000

(51) Int. Cl.[7] .................................................. H01L 27/14
(52) U.S. Cl. ........................................... 257/414; 438/745
(58) Field of Search ..................................... 257/414, 433; 438/5, 8, 745, 748, 749, 750

(56) References Cited

U.S. PATENT DOCUMENTS

| | | | |
|---|---|---|---|
| 4,018,949 | 4/1977 | Donakowski et al. | 427/327 |
| 4,271,007 | * 6/1981 | Souhrada et al. | 208/48 R |
| 4,482,425 | 11/1984 | Battey | 156/637 |
| 4,973,379 | 11/1990 | Brock et al. | 156/640 |
| 5,143,121 | * 9/1992 | Steinhardt et al. | 137/624.13 |
| 5,445,705 | 8/1995 | Barbee et al. | 156/627.1 |
| 5,456,788 | 10/1995 | Barbee et al. | 156/345 |
| 6,071,373 | 6/2000 | Kang et al. | 156/345 |
| 6,123,865 | 9/2000 | Lin et al. | 216/91 |
| 6,224,728 | * 5/2001 | Oborny et al. | 204/450 |

* cited by examiner

*Primary Examiner*—David Nelms
*Assistant Examiner*—Quoc Hoang
(74) *Attorney, Agent, or Firm*—Brinks Hofer Gilson & Lione

(57) ABSTRACT

A chemical etching manufacturing system is provided for removing material from a workpiece comprising a fluid control device, wherein the fluid control device controls at least one of fluid flow and fluid pressure, a fluid injection device, and a pulsed flow of chemical etchant adapted to pulsedly contact and remove material from a workpiece, wherein the pulse of the pulsed flow of chemical etchant is controlled by the fluid control device, and the pulsed flow of chemical etchant is emitted from the fluid injection device. A method of chemical etching in a manufacturing system is also provided comprising providing a workpiece, introducing the workpiece to a pulsed flow of chemical etchant, wherein the flow of chemical etchant pulsedly contacts and removes material from the workpiece, and removing the workpiece from the pulsed flow of chemical etchant.

15 Claims, 2 Drawing Sheets

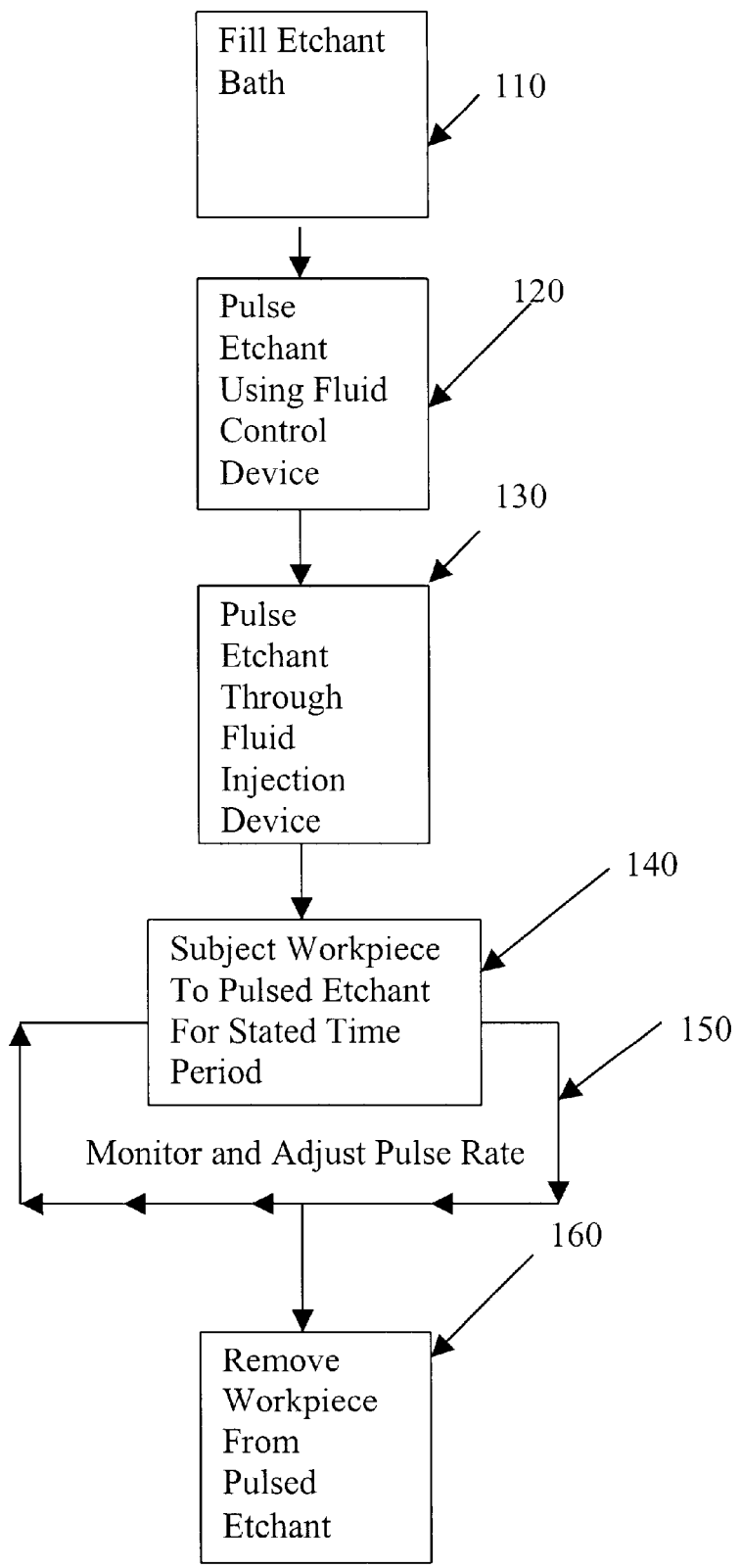

PULSED ETCHING MANUFACTURING METHOD AND SYSTEM

BACKGROUND OF THE INVENTION

This invention relates generally to the use of a pulsed flow of chemical etchant in chemical etching manufacturing systems to remove material from a workpiece, and to a method for use thereof.

There are a wide variety of conventional chemical etching manufacturing systems using a continuous flow of etchant to remove material from a workpiece including spray etching, immersion etching, and bubble etching. The use of a uniform flow of etchant in each of these conventional chemical etching manufacturing systems is subject to certain limitations and disadvantages.

In spray etching systems, a workpiece is horizontally or vertically positioned in a box-like chamber with spray nozzles directing a uniform flow of etchant against the workpiece. The spray nozzles are oriented to enhance coverage of etchant on the workpiece as well as to introduce fresh etchant to the workpiece coverage area. The use of a uniform flow of etchant on a horizontally or vertically positioned workpiece generally results in non-uniform etching with different areas of the workpiece receiving varying amounts of etchant, especially at the edges of the workpiece.

In immersion etching systems, a workpiece is immersed in chemical etchant until the etching is complete. Process times are generally long and known heating and mechanical agitation methods tend to lead to non-uniform etching.

Bubble etching is a modified form of immersion etching, using air bubbled through the chemical etching solution past the workpiece being etched. The bubbling of air assists in removing material and providing fresh etchant at the etched surface. However, it is often difficult to obtain a uniform distribution of bubbles throughout the workpiece and therefore difficult to obtain uniform etching.

In all of these chemical etching manufacturing systems, the use of an uniform flow of etchant on a workpiece may lead to problems with non-uniform etching and to overall difficulties with the precision of the etching.

BRIEF SUMMARY OF THE INVENTION

It is in general an object of the invention to provide more uniform etching through the use of a pulsed flow of chemical etchant in chemical etching manufacturing systems. Improvement may also be obtained in the etch rate and etch quality, such as the undercut on the etched workpiece.

In a preferred embodiment, the chemical etching manufacturing system includes a fluid control device, a fluid injection device, and a pulsed flow of chemical etchant. At least one of fluid flow and fluid pressure is controlled by the fluid control device. The pulsed flow of chemical etchant is adapted to pulsedly contact and remove material from a workpiece. Control over the pulse of the pulsed flow of chemical etchant is regulated by the fluid control device. The pulsed flow of chemical etchant is emitted from the fluid injection device.

In another aspect, a method of chemical etching in a manufacturing system is detailed. Initially, a workpiece is provided. Next, the workpiece is introduced to a pulsed flow of chemical etchant. The flow of chemical etchant pulsedly contacts and removes material from the workpiece. Finally, the workpiece is removed from the pulsed flow of chemical etchant.

In yet another aspect, another method of chemical etching in a manufacturing system is detailed. Initially, a workpiece, a fluid control device, and a fluid injection device are provided. The fluid control device controls at least one of fluid flow and fluid pressure. Next, the workpiece is introduced to a pulsed flow of chemical etchant. The flow of chemical etchant pulsedly contacts and removes material from the workpiece. Control over the pulse of the pulsed flow of chemical etchant is regulated by the fluid control device, and the pulsed flow of chemical etchant is emitted from the fluid injection device. Finally, the workpiece is removed from the pulsed flow of chemical etchant.

The present invention provides significant advantages over other uniform flow chemical etchant methods and systems. In particular, the method and system of the present invention more thoroughly breaks up the surface to be etched in workpieces, enhances mixing of etchant, provides improved flow of fresh etchant on the surface to be etched, and promotes uniformity of etching by making the etching process less sensitive to flow at the edges of the surface to be etched.

The present invention, together with further objects and advantages, will be best understood by reference to the following detailed description taken in conjunction with the accompanying drawings.

BRIEF DESCRIPTION OF THE DRAWINGS

FIG. 2 is a flow chart detailing a method of chemical etching implementing the present invention.

DETAILED DESCRIPTION OF THE INVENTION

Figure 1:
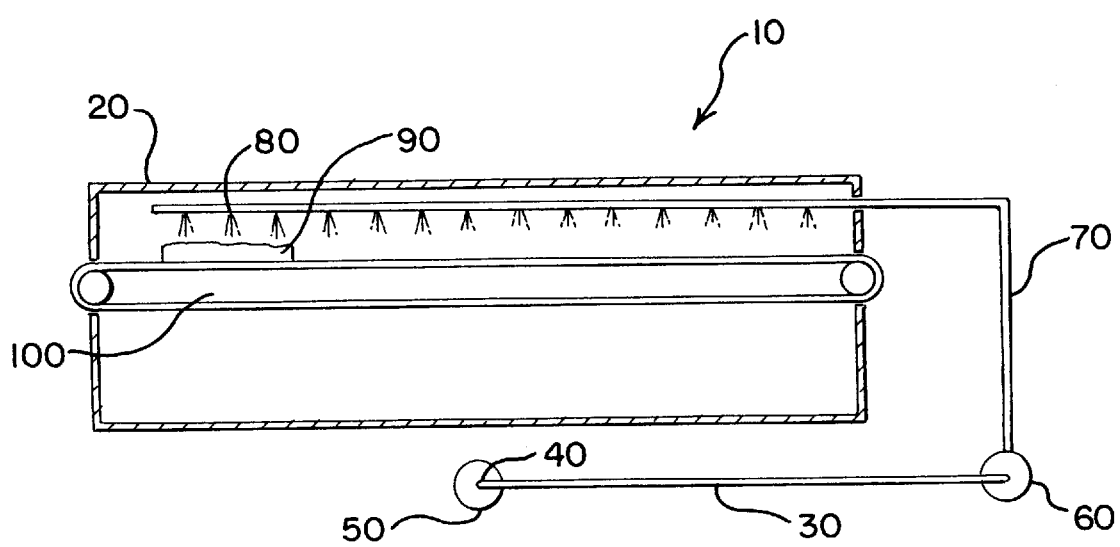
FIG. 1 is a cut-away front view of a spray etching system implementing the present invention.

Referring to FIG. 1, a preferred embodiment of a chemical etching manufacturing system 10 is shown. The embodiment depicted is a spray etching system as known in the art, with additional components, disclosed below, to pulse the flow of chemical etchant. The invention's disclosure, of additional components to pulse the flow of chemical etchant is applicable to other manufacturing etching systems known in the art, including immersion etching systems amongst other known systems. It is to be understood that the preferred embodiment shown details the necessary components required to obtain the invention's disclosure of a pulsed flow of etchant without providing further components in a spray etching system, which are known in the art and are not the subject of the instant invention.

In the preferred embodiment, the etching system 10 includes a chamber 20 of an appropriate size for the particular etching process. An etchant input line 30 delivers chemical etchant 40 from a source 50 to a fluid control device 60, wherein the fluid control device controls at least one of fluid flow and fluid pressure. The fluid control device 60 is a device for controlling the pressure and/or the flow of the etchant 40 and allows the flow of the etchant 40 to be pulsed. A sampling of some of the devices which are fluid control devices include a pump, a reciprocating pump, a positive displacement pump, a valve, a rotating valve, and a pulsed valve. In addition to pulsing the flow of the etchant 40, the fluid control device 60 also preferably allows the pulsing frequency of the flow of the etchant 40 to be varied by adjusting the fluid control device 60. Although a wide variety of pulsing rates may be used, preferably the pulsing rate ranges from 5 to 1,000 pulses per minute. This pulsing may be combined with nozzle oscillation to produce optimized etching on the workpiece.

After the fluid pressure control device 60 pulses the flow of the etchant 40, the pulsed etchant 40 flows through an etchant output line 70, then is emitted from a fluid injection device 80, and then pulsedly contacts the surface of a workpiece 90 to be etched. The fluid injection device 80 is simply a device which directs etchant onto a surface to be etched, and includes, among other devices, a nozzle, and an oscillating nozzle. It is to be noted that for purposes of the invention, one device may act as both a fluid pressure control device and as a fluid injection device if it accomplishes the purposes of both devices. For example, an oscillating nozzle may act as both a fluid pressure control device and as a fluid injection device if it controls the pressure and/or the flow of etchant allowing the flow of the etchant to be pulsed, in addition to directing etchant onto the surface of the workpiece to be etched. The workpiece 90 includes any object which is to be etched, including, among others, a circuit board, a plate, and a substrate.

The workpiece 90 is held in place within the chamber 20 by a workpiece holding device 100. The workpiece holding device 100 includes any device used to hold a workpiece including, among other devices, a conveyor, and other types of attachment apparatus known in the art.

Disclosed in FIG. 2 is a method of chemical etching in a manufacturing system to remove material from a workpiece using a pulsed flow of chemical etchant. The first step 110 is filling a bath with chemical etchant. The next step 120 is pulsing etchant from the bath using a previously defined fluid control device. The next step 130 is pulsedly emitting the etchant, which is being pulsed by the fluid control device, through a previously defined fluid injection device. The next step 140 is subjecting a previously defined workpiece to the pulsed flow of chemical etchant, which is being pulsedly emitted from the fluid injection device, for a pre-determined time period. It is to be understood that the pulsed flow of chemical etchant pulsedly contacts and removes material from the workpiece. During the time period the workpiece is subjected to the pulsed flow of chemical etchant, an optional step 150 is monitoring and adjusting the pulse rate of the etchant. The final step 160 is removing the workpiece from the pulsed flow of chemical etchant. It is to be understood that this method is applicable to any manufacturing etching system utilizing these steps, and includes spray and immersion etching systems amongst other known systems.

The object of the instant invention, a pulsed flow of chemical etchant, provides significant advantages over other uniform flow chemical etchant systems and methods in that a pulsed flow of chemical etchant more thoroughly breaks up the surface to be etched in workpieces, enhances mixing of etchant, provides improved flow of fresh etchant on the surface to be etched, and promotes uniformity of etching by making the etching process less sensitive to flow at the edges of the surface to be etched.

Although the present invention has been described with reference to preferred embodiments, those skilled in the art will recognize that changes may be made in form and detail without departing from the spirit and scope of the invention, which discloses the use of a pulsed flow of chemical etchant in a manufacturing system and methods for use thereof. For example, it is to be understood that a pulsed flow of etchant, as disclosed in this invention, may be used in an immersion system, as known in the art. As such, it is intended that the foregoing detailed description be regarded as illustrative rather than limiting and that it is the appended claims, including all equivalents thereof, which are intended to define the scope of the invention.

We claim:

1. A chemical etching manufacturing system for removing material from a workpiece comprising:
   a fluid control device, wherein the fluid control device controls at least one of fluid flow and fluid pressure;
   a fluid injection device; and
   a pulsed flow of chemical etchant adapted to pulsedly contact and remove material from a workpiece, wherein the pulse of the pulsed flow of chemical etchant is controlled by the fluid control device, and the pulsed flow of chemical etchant is emitted from the fluid injection device.

2. The chemical etching manufacturing system of claim 1 wherein the system is a chemical immersion etching system.

3. The chemical etching manufacturing system of claim 1 wherein the system is a chemical spray etching system.

4. The chemical etching manufacturing system of claim 1 wherein the fluid control device is a pump.

5. The chemical etching manufacturing system of claim 4 wherein the pump is a reciprocating pump.

6. The chemical etching manufacturing system of claim 4 wherein the pump is a positive displacement pump.

7. The chemical etching manufacturing system of claim 1 wherein the fluid control device is a valve.

8. The chemical etching manufacturing system of claim 7 wherein the valve is a rotating valve.

9. The chemical etching manufacturing system of claim 7 wherein the valve is a pulsed valve.

10. The chemical etching manufacturing system of claim 1 wherein the fluid injection device is a nozzle.

11. The chemical etching manufacturing system of claim 10 wherein the nozzle is an oscillating nozzle.

12. The chemical etching manufacturing system of claim 1 further comprising a workpiece holding device.

13. The chemical etching manufacturing system of claim 12 wherein the workpiece holding device is a conveyor belt.

14. The chemical etching manufacturing system of claim 1 wherein the pulse of the pulsed flow of chemical etchant ranges from 5 to 1,000 pulses per minute.

15. The chemical etching manufacturing system of claim 1 further comprising a chamber device adapted to contain a workpiece.

* * * * *